May 30, 1972 K. S. TARNEJA ET AL 3,666,574

PHOSPHORUS DIFFUSION TECHNIQUE

Filed Sept. 6, 1968

1

3,666,574
PHOSPHORUS DIFFUSION TECHNIQUE

Krishan S. Tarneja, Pittsburgh, Pa., Vito A. Rossi, Hawthorne, Calif., and James B. McNally, Irwin, Pa., assignors to Westinghouse Electric Corporation, Pittsburgh, Pa.

Filed Sept. 6, 1968, Ser. No. 757,852
Int. Cl. H01l 7/36, 7/44
U.S. Cl. 148—188 8 Claims

ABSTRACT OF THE DISCLOSURE

Webbed dendritic material having clean shiny surfaces after diffusion and post-diffusion cleaning processes is made possible by embodying a diffusion process which first forms an oxide coating on the surfaces and then diffuses the impurity into the webbed dendritic material through the oxide coating.

BACKGROUND OF THE INVENTION

(1) Field of the invention

This invention relates to solar cells and in particular to a process for diffusing phosphorus into webbed dendritic semiconductor material.

(2) Description of the prior art

Heretofore it has been shown conclusively that p-type semiconductivity base silicon solar cells are considerably more radiation resistant than similar n-type semiconductivity base solar cells. The p-n junction of a p-type semiconductivity base material is formed by diffusing phosphorus into p-type material. The requirements for a high efficiency solar cell is that the cell have a very shallow junction depth, that is the penetration of a diffused layer should be no greater than from ⅓ micron to ½ micron. The surface concentration of the impurity diffused into the base material region of a solar cell should be high. The carrier lifetime in both the diffused region and base region should also be high.

The usual source of phosphorus is phosphorus pentoxide ($P_2O_5$). $P_2O_5$, however, attacks silicon in the presence of small amounts of oxygen whereby the surface of the silicon body becomes pitted. The phosphorus diffusion rate is sufficiently fast enough that difficulty in obtaining junction depth while from 0.3 to 0.5 micron in depth is always prevalent. When silicon webbed dendritic material is employed in the manufacture of solar cells, it is desirable that the naturally occurring shiny, essentially defect free surfaces of the webbed dendritic material be retained after the diffusion for the deposition of evaporated material electrical contacts thereon.

SUMMARY OF THE INVENTION

In accordance with the teachings of this invention, there is provided a method for producing a phosphorus diffused layer in a body of semiconductor material comprising heating a body of semiconductor material, in one portion of an open furnace, from one elevated temperature to another higher elevated temperature; causing a gaseous mixture of oxygen and nitrogen to flow about the body while the body is heating for a predetermined time in order to form an oxide layer on the body; introducing a source of phosphorus into another portion of the open tube furnace upstream from the body; causing the gaseous mixture to pass first over the source of phosphorus and then next over the body; raising the temperature of the body to a still higher elevated temperature while retaining the flow of mixed gases; retaining the body at the still higher elevated temperature in the flow of mixed gases for a predetermined period of time; removing the source of phosphorus from the furnace; and cooling the body in the gaseous mixture to a predetermined lower temperature.

An object of this invention is to provide a process for accurately controlling the p-n junction depth obtained by the diffusion of phosphorus into a body of semiconductor material.

Another object of this invention is to provide a process whereby the material into which the impurity phosphorus is being diffused is not attacked by either the source of the impurity or the impurity itself.

Another object of this invention is to provide a process whereby the naturally occurring substantially defect free surfaces of webbed dendritic semiconductor material is not affected by the process.

Other objects of this invention will, in part, be obvious and will, in part, appear hereinafter.

DRAWINGS

For a better understanding of the nature and objects of this invention, reference should be had to the following drawings in which.

DESCRIPTION OF THE INVENTION

Figure 1:
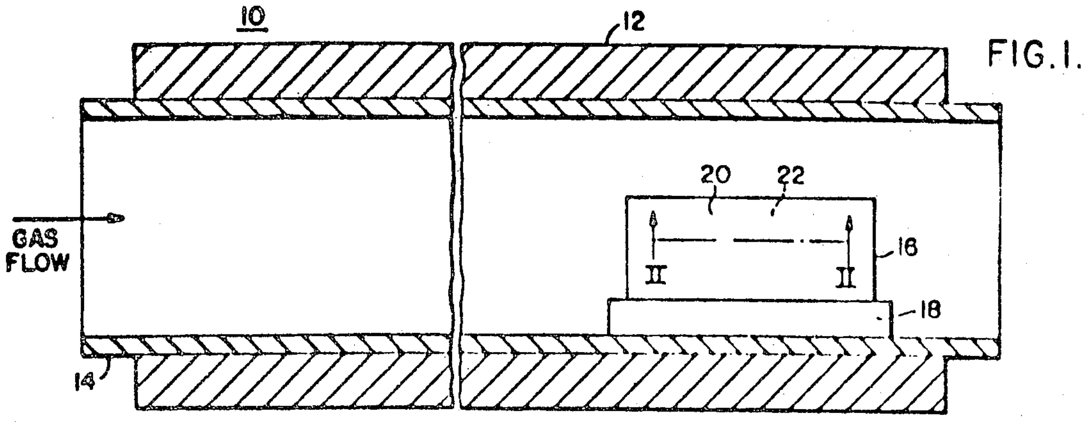
FIG. 1 is a view, partly in cross-section, of a portion of a system for diffusing phosphorus into a body of semiconductor material in accordance with the teachings of this invention.

With reference to Fig. 1, there is shown a portion of a system 10 suitable for the performance of a phosphorus diffusion in accordance with the teachings of this invention.

The system 10 comprises a suitable open tube furnace 12. The furnace 12 has a circular wall 14. A body 15 of suitable semiconductor material is disposed on a suitable carrier 18 in one portion of the furnace 12. The semiconductor material may be silicon, germanium, silicon carbide, and Group III–IV compounds as well as Group II–VI compounds. Additionally, the body 16 has a p-type semiconductivity and a resistivity of at least 1 to 20 ohm-centimeter. A preferred resistivity of 10 ohm-centimeter is desired when the body 10 is being processed to make a solar cell device.

For purposes of more specifically describing the teachings of this invention, and for no other purpose, the body 16 will be illustrated and described as consisting of a web portion of silicon dendritic material being processed into a solar cell.

Webbed silicon dendritic material inherently has, in an as-grown condition, two major opposed surfaces 20 and 22 which are shiny and essentially defect free. The surfaces 20 and 22 are very desirable for vapor deposition of metallic contacts to the body 16. However, prior art diffusion techniques embodying phosphorus pentoxide resulted in the pitting of the surfaces 20 and 22.

Therefore to protect the surfaces 20 and 22, as well as to control the rate of diffusion and the p-n junction depth in the body 16, the body 16 is first etched in a concentrated hydrofluoric acid both to remove the inherently present naturally occurring silicon oxide film from all surfaces. The body 16 is then rinsed in alcohol and deionized water, dried and placed on the carrier 18 in the furnace 12. The body 16 and the carrier 18 are located in the high temperature zone of the furnace 12.

Initially, the body 16 is inserted into the high temperature zone of furnace 12 where the temperature is 700° C. ±2.0° C. A mixture of pure dry oxygen and nitrogen gases is caused to flow through the furnace 12 and about the body 16 for approximately 15 minutes as the temperature of the body 16 is raised to 875° C. ±2.0° C.

Figure 2:
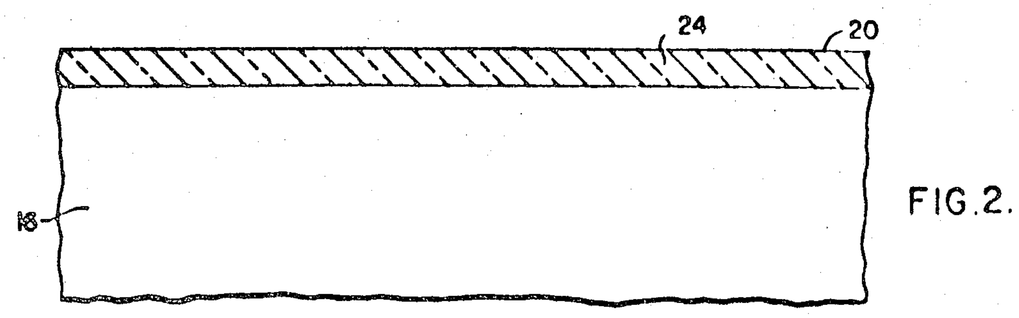
FIG. 2 is a cross-sectional view of a portion of the body of semiconductor material processed in the system shown in FIG. 1.

With reference to FIG. 2, there is shown a view of the body 16 after exposure to the gaseous mixture for approximately 15 minutes. A layer 24 of silicon oxide is formed comprising the surface 20 of the body 16. The layer 24 of silicon oxide is thick enough to prevent the surface of the body 16, which will be exposed after subsequent processing, from the normal attacking and pitting by the phosphorus pentoxide which occurs naturally during a subsequent diffusing process particularly in the presence of oxygen. Additionally, the layer 24 is still thin enough to enable elemental phosphorus, deposited on surface 20 of the oxide layer 24 of the body 16, to be diffused into the body 16.

Oxygen gas alone is sufficient to act both as a means for oxidizing the surface 20 of the body 16 and to transport the phosphorus pentoxide from a source to the body 16. However, it has been found desirable to dilute the oxygen gas in the stream. This allows one to form the layer 24 of silicon oxide at a slower rate and thereby more accurately control the thickness of the layer 24. Additionally, one wishes to form the p-n junction in the body 16 at a slow rate so as to enable one to obtain a better control of the junction depth. The total gas flow in the system is sufficient to transport the required phosphorus pentoxide for the diffusion portion of the process. The oxygen is present in a sufficient amount to maintain an oxidizing atmosphere to retain the oxide layer 24 which in turn inhibits the rate of reaction of the phosphorus pentoxide with the body 16 and so thereby control the rate of diffusion into the body 16.

It has been found that at a preferred diffusion temperature, the total gas flow should be from 550 to 660 cubic centimeters for a furnace diameter of 60 mm. Of this total gas flow, it has been found preferable to have oxygen comprising approximately 9% of the total gas flow. Since it is desirable to have one continuous process it is therefore preferred that the gas flow mixture be also employed to form the oxide layer 24 rather than adjusting the gas mixture in the middle of the process.

Accordingly, the total gas flow during the formation of the oxide layer 24 is from 550 to 660 cubic centimeters. Of this flow, from 50 to 60 cubic centimeters per minute is oxygen gas flow. The gas flow rate of oxygen is preferably 56 cubic centimeters per minute.

Figure 3:
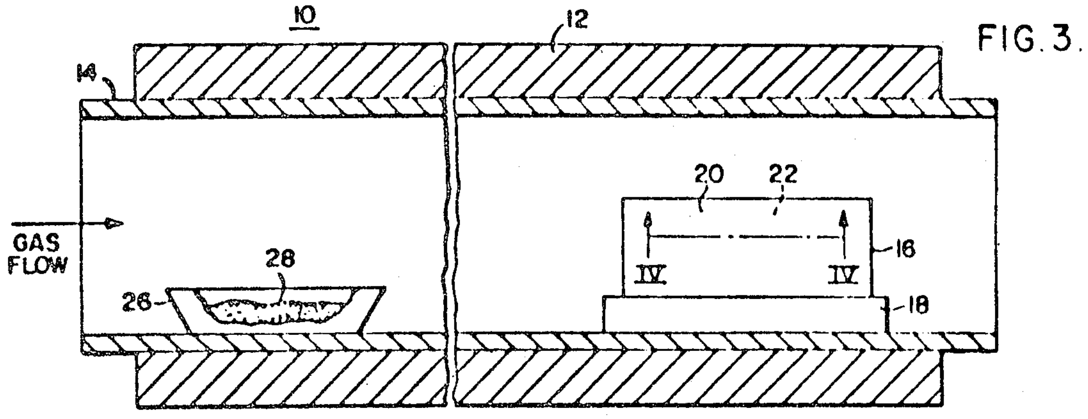
FIG. 3 is a view, partly in cross-section, of a system (including the portion of the system in FIG. 1) for diffusing phosphorus into a body of semiconductor material in accordance with the teachings of this invention.

Upon reaching a temperature of approximately 875° C., and referring now to FIG. 3, a crucible, or a boat 26 of a source 28 of phosphorus pentoxide is placed in a second portion of the furnace 12. The phosphorus pentoxide source 28 is retained at a temperature of 310° C. ±5° C. while the body 16 is slowly raised to a temperature of 925° C. ±2° C., the temperature excursion for the body 16 occurring in approximately 15 minutes. The body 16 is retained at this elevated temperature for approximately 30 minutes.

Figure 4:
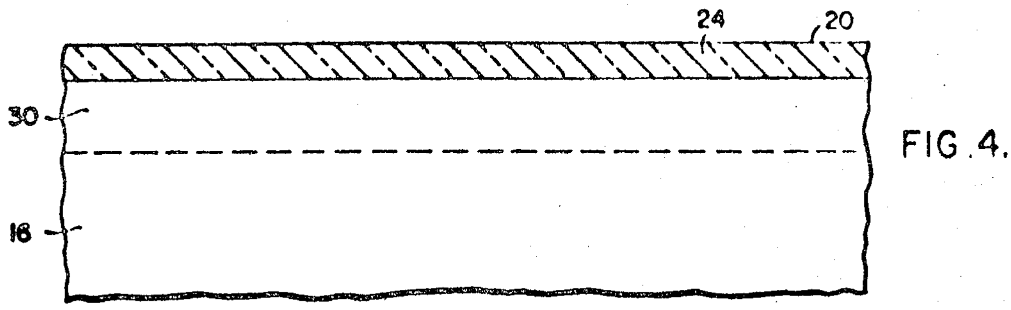
FIG. 4 is a cross-sectional view of a portion of the body shown in the system of FIG .3.

After approximately 30 minutes at the elevated temperature, during which time phosphorous is continuously being deposited on the surfaces 20 and 22 and diffused through the oxide layer 24 into the body 16, forming a phosphorus diffused region 30 (FIG. 4), the source 28 of phosphorus pentoxide in the crucible or boat 26 is removed from the surface 12. The gaseous mixture of oxygen and nitrogen is continued at the previous total gas flow rate while the body 16 is cooled to approximately 600° C. ±10° C. Approximateliy 45 minutes is required to cool the body 16 to approximately 600° C., at which time the body 16 is removed from the furnace 12.

Upon removal from the furnace 12, the major surface which is to serve as the back surface of the solar cell is sandblasted or etched to remove that portion of the oxide layer 24 formed thereon. The back surface of the body 16 is preferably roughened by sandblasting to assure good adherence of an electrical contact subsequently diffused thereto. The remainder of the oxide layer 24 is removed by suitable etching means such, for example as by etching the body 16 in hydrofluoric acid for 5 minutes. The etching of the body 16 to remove the remainder of the layer 24 also removes the damaged silicon material comprising the sandblasted area of the body 16.

Examination of the major surface of each body 16 not sandblasted after diffusion consistently revealed the same essentially damage free, shiny surface which webbed dendritic semiconductor material exhibits in an as-grown condition. The surface was not pitted thereby indicating that the silicon oxide layer 24 did indeed protect the surface from attack by phosphorus pentoxide in the presence of oxygen. Further examination of the processed bodies 16 revealed that the p-n junction in each body was substantially parallel to the top surface and located in the preferred range of from 0.3 micron to 0.5 micron from the top surface.

The phosphorus diffusion method embodying the teachings of this invention provides a means for producing and controlling the shallow p-n junction depth in a body of webbed dendritic semiconductor material while retaining the inherent substantially defect free, shiny surface of the as-grown material.

While the invention has been described with reference to particular embodiments and examples, it will be understood of course, that modifications, substitutions, and the like may be made therein without departing from its scope.

We claim as our invention:

1. A method for producing a phosphorus diffused layer in a body of semiconductor material comprising:

(1) heating a body of semiconductor material in one portion of an open tube furnace to an elevated temperature;

(2) causing a gaseous mixture of oxygen and nitrogen to flow about said body while said body is being heated for a predetermined time in order to form an oxide layer on said body;

(3) introducing a source of phosphorus into another portion of said open tube furnace, upstream from said body;

(4) causing said gaseous mixture to pass first over said source of phosphorus and then next over said body;

(5) raising the temperature of said body to a still higher elevated temperature while retaining the flow of said gases;

(6) retaining said body at said still higher elevated temperature in the flow of mixed gases for a predetermined period of time;

(7) removing said source of phosphorus from said furnace; and (8) cooling said body in said gaseous mixture to a predetermined lower temperature.

2. The method of claim 1 in which the gaseous mixture consists of 1 part by volume of oxygen and 10 parts of nitrogen by volume.

3. The method of claim 2 including:

the body of semiconductor material comprises silicon;

heating of the body of silicon is from 700° C. ± to 2° C. to approximately 875° C.; and raising the temperature of the body of silicon to 925° C. ±20° C.

4. The method of claim 3 including:

heating said body of silicon in an open tube furnace having an inner diameter of 60 mm.;

heating said body from 700° C. ±2° C. to 875° C. in approximately 15 minutes; and retaining said body of silicon at 925° C. ±2° for approximately 30 minutes.

5. The method of claim 4 including:

cooling said body from 925° C. to 600° C. ±10° C. in approximately 45 minutes.

6. The method of claim 5 in which the gaseous mixture has a total gas flow rate of from 550 cubic centimeters per minute to 606 cubic centimeters per minute.

7. The method of claim 6 in which the gaseous mixture has a total gas flow rate of 616 cubic centimeters per minute.

8. The method of claim 7 in which:

heating a body comprising webbed dendritic semiconductor material occurs in said open tube furnace.

References Cited

UNITED STATES PATENTS

| | | | |
|---|---|---|---|
| 2,823,149 | 2/1958 | Robinson | 148—187 |
| 3,260,626 | 7/1966 | Schink | 148—188 |
| 3,418,182 | 12/1968 | Forrest | 148—188 |
| 3,476,619 | 11/1969 | Tolliver | 148—188 |
| 3,478,253 | 11/1969 | Yeh et al. | 148—186 |

FOREIGN PATENTS

| | | | |
|---|---|---|---|
| 1,270,009 | 6/1968 | Germany | 148—187 |

L. DEWAYNE RUTLEDGE, Primary Examiner

R. A. LESTER, Assistant Examiner

U.S. Cl. X.R.

117—106, 201; 148—187, 189